United States Patent [19]
Ayata

[11] Patent Number: 4,713,784
[45] Date of Patent: Dec. 15, 1987

[54] ALIGNMENT APPARATUS

[75] Inventor: Naoki Ayata, Machida, Japan

[73] Assignee: Canon Kabushiki Kaisha, Tokyo, Japan

[21] Appl. No.: 623,088

[22] Filed: Jun. 21, 1984

[30] Foreign Application Priority Data

| Jul. 4, 1983 | [JP] | Japan | 58-120192 |
| Jul. 7, 1983 | [JP] | Japan | 58-122344 |
| Jul. 16, 1983 | [JP] | Japan | 58-130099 |
| Sep. 6, 1983 | [JP] | Japan | 58-162602 |
| Sep. 6, 1983 | [JP] | Japan | 58-162603 |

[51] Int. Cl.$^4$ .............................. G06F 15/46
[52] U.S. Cl. ........................ 364/559; 356/153; 356/400
[58] Field of Search ............ 364/559, 488–491; 340/347 SH; 356/138, 400, 153; 250/237 R, 561

[56] References Cited

U.S. PATENT DOCUMENTS

| 4,115,762 | 9/1978 | Akiyama et al. | 364/559 X |
| 4,259,019 | 3/1981 | Johannsmeier et al. | 364/559 X |
| 4,342,090 | 7/1982 | Caccoma et al. | 364/559 X |
| 4,393,371 | 7/1983 | Morgan-Smith | 340/347 SH |
| 4,413,186 | 11/1983 | Uema | 364/559 X |
| 4,466,073 | 8/1984 | Boyan et al. | 364/559 |

Primary Examiner—Gary V. Harkcom
Assistant Examiner—H. R. Herndon
Attorney, Agent, or Firm—Fitzpatrick, Cella, Harper & Scinto

[57] ABSTRACT

An alignment apparatus includes an illumination source for illuminating an object having a mark, a photoreceptor for receiving light reflected by the object, a converter for digitizing the output signal level of the photoreceptor, a circuit for determining a slice level on the basis of the data digitized by said converter, a device for comparing the digitized data and the slice level to extract a signal relating to the mark and determining the interval between the mark and a reference, and a device for causing relative movement between the object having the mark and the object having the reference mark to place them into alignment with each other.

9 Claims, 24 Drawing Figures

FIG. I

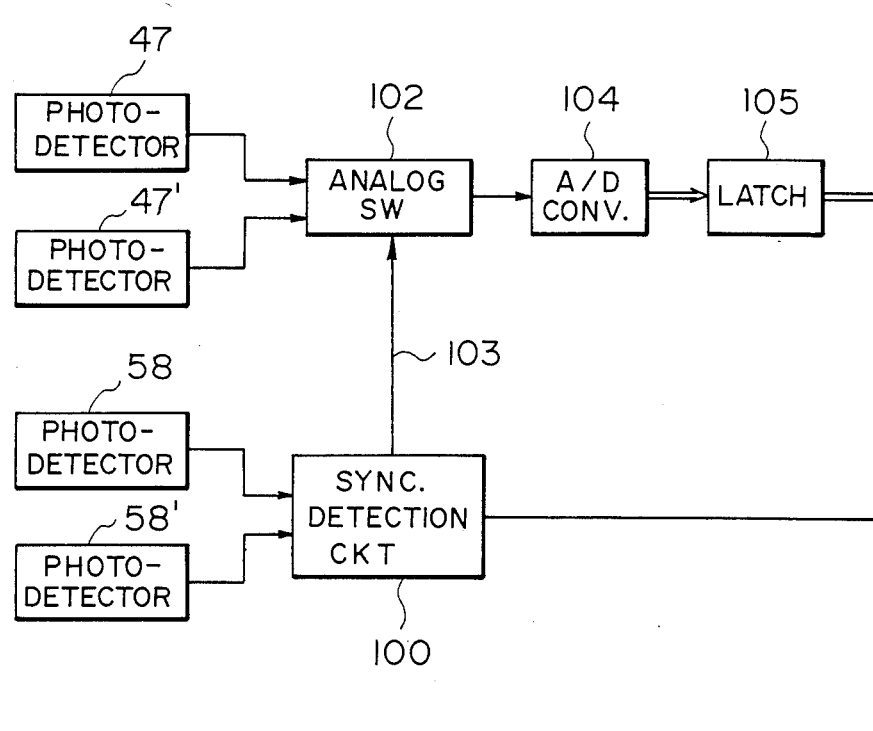
F I G. 7A
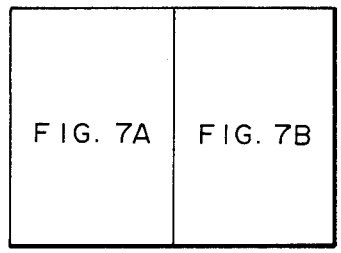
F I G. 7

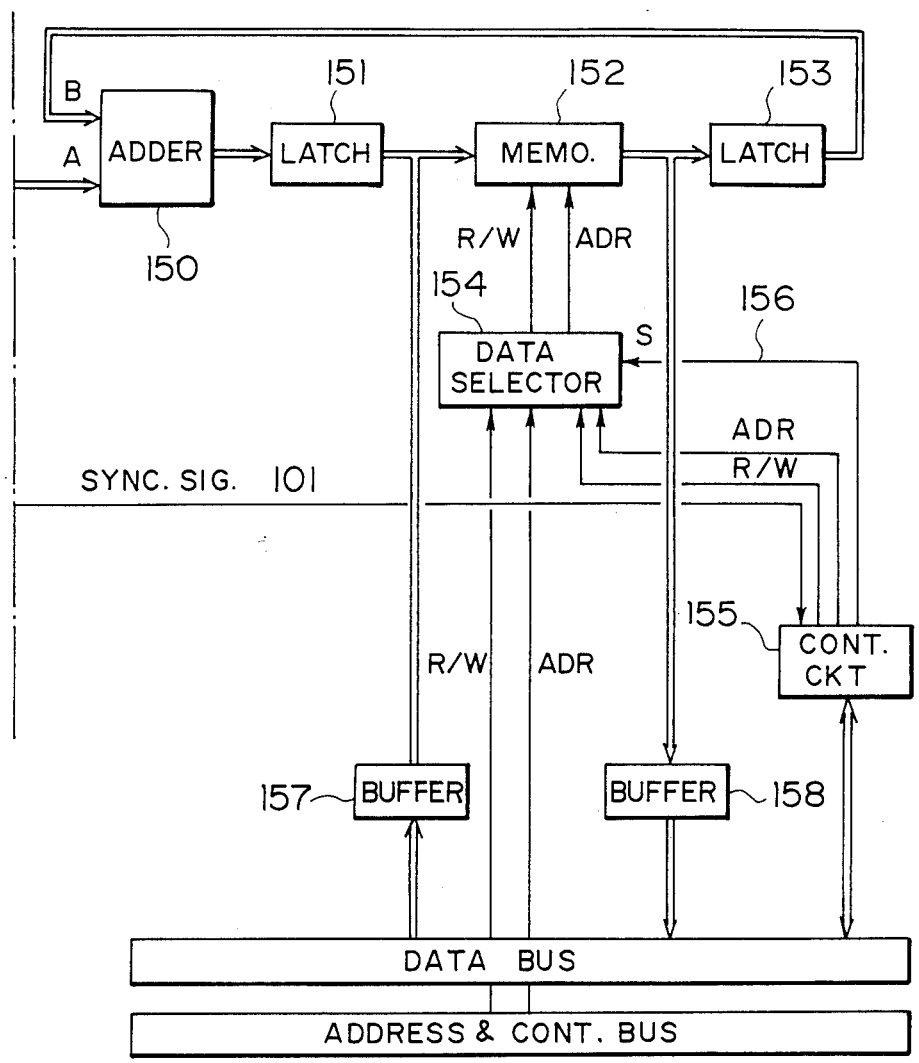
F I G. 7B

ALIGNMENT APPARATUS

BACKGROUND OF THE INVENTION

The present invention relates to an apparatus for aligning two objects. More particularly, the present invention relates to a detection of an alignment mark on a mask or reticle or of an alignment mark on a wafer prior to aligning a semiconductor circuit pattern on a reticle or a mask with a wafer.

A semiconductor circuits manufacturing includes steps of sequentially printing several patterns on a wafer to form an integrated semiconductor circuit. Those steps require that the wafer and the mask bearing a pattern are aligned with each other with a high precision so as to correctly align a pattern of a mask to the pattern which has been printed on the wafer in the previous step or steps. Prior to the alignment operation, alignment marks formed on the mask and the wafer are photoelectrically detected to determine a relative positional relation therebetween, and then a relative movement between the mask and the wafer is made on the basis of the positional determination.

The alignment mark of the mask or wafer is detected by a signal produced by the mark being at a peak level which is over a predetermined reference level. Heretofore, the reference level has been fixed so that it may be too high or low depending on the kind of the wafer or the mask being processed. Those improper reference levels may result in failure of the detection of the alignment marks. It is known that, when the detection fails, the reference level is manually changed.

SUMMARY OF THE INVENTION

It is a principal object of the present invention to provide an alignment apparatus wherein a correct alignment is effected between two objects, for example, a wafer and a mask having an integrated circuit pattern, or a semiconductor device and a tool for processing them.

It is a second object of the present invention to provide an alignment apparatus wherein a signal related to a mark is correctly picked up, even if it is relatively weak in a series of signals produced from an object having an alignment mark, and wherein a signal is then produced to correct the positional displacement between two objects.

It is a third object of the present invention to provide an alignment apparatus wherein, in order to pick up a correct signal related to a mark from a series of low level signals, a suitable slice level is determined.

It is a fourth object of the present invention to provide an alignment apparatus wherein the slice level is automatically changed in response to the intensity of the correct signal from the produced signals.

It is a fifth object of the present invention to provide an alignment apparatus wherein there is a reduced possibility that electric noise or the like is added to the series of the signals to cause overlooking of the correct signals, or that the noise is erroneously taken as an alignment mark signal.

It is a sixth object of the present invention to provide an alignment apparatus wherein a position correcting signal is produced in accordance with the precision required for the alignment, more particularly the number of scanning operations is selectable in accordance with the precision so that the time required for the alignment operation is reduced.

It is a seventh object of the present invention to provide an alignment apparatus wherein plural preliminary steps for determining the slice level are executed parallel so as to reduce the time required for the operation.

It is an eighth object of the present invention to provide an alignment apparatus wherein a waveform of the series of the signals detected is stored in a memory so that, even if the slice level is improper, the series of the signals is re-processed with a slice level modified in accordance with the memorized information, thus eliminating the necessity of an additional mesurement.

It is a ninth object of the present invention to provide an alignment apparatus wherein the series of the detected signals is digitized to digital data, which are then superposed and memorized, and wherein the memorized information is processed by hardware comprising a comparison circuit, a counting circuit, a memory circuit and others, thus increasing the speed of the signal processing.

These and other objects, features and advantages of the present invention will become more apparent upon a consideration of the following description of the preferred embodiments of the present invention taken in conjunction with the accompanying drawings.

BRIEF DESCRIPTION OF THE DRAWINGS

FIGS. 7A and 7B are a block diagram of a position detecting circuit used with a further embodiment of the present invention.

DESCRIPTION OF THE PREFERRED EMBODIMENTS

The preferred embodiments of the present invention will be described in conjunction with the accompanying drawings.

Figure 1:
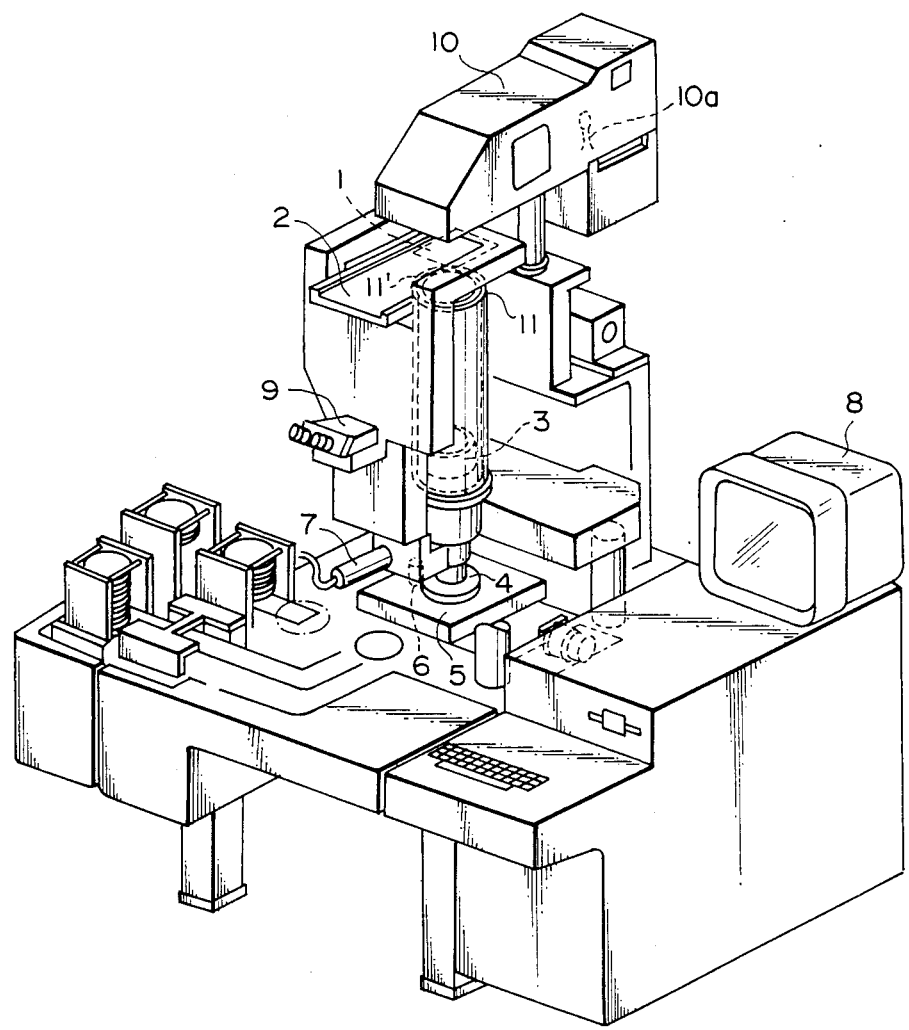
FIG. 1 is a perspective view of a stepper, that is, a step-and-repeat type mask aligner to which the present invention is used.

In FIG. 1 there is shown an alignment and exposure device provided with a position detecting circuit according to an embodiment of the present invention. A mask 1 having an integrated circuit pattern, mask alignment mark and mask-wafer alignment marks, is held on a mask stage 2 which supports the mask 1 and translates and rotates in a plane. The pattern of the mask 1 is optically projected through a reduction projection lens 3 onto a wafer 4 having a photosensitive layer, mask-wafer alignment marks and wafer alignment marks. The wafer 4 is supported on a wafer stage 5 which supports the wafer 4 and translates and rotates it in a plane. Also, the wafer stage 5 is movable between an exposure position which is within a projection field of the reduction projection lens 3 and a TV wafer alignment station. The TV wafer alignment station comprises a detection objective lens 6, an image pick-up tube or a solid-state image pick-up element and a TV display 8 for observation. For an additional observation facility, there is provided a binocular unit 9 which allows observation of the surface of the wafer 4 through the projection lens 3. The alignment and exposure apparatus further includes an upper unit 10 which contains an illumination optical system for converging the mask illumination light produced by a light source 10a and a detection system for aligning the mask 1 and the wafer 4. The wafer stage 5 receives at a predetermined position a wafer fed by wafer feeding means (not shown) and convey the wafer 4 to the TV wafer alignment station so that the alignment mark on the wafer is placed within the field of view of the objective lens 6. The accuracy of the positioning at this step is dependent on the accuracy of a mechanical alignment, and the view field of the objective lens 6 is approx. 1–2 mm in diameter. The alignment mark in this view field is detected by the image pick-up tube 7, and the position thereof is determined on coordinates with its original of a TV wafer alignment reference mark provided within an optical system for the TV wafer alignment, which will be described hereinafter. A distance between the TV wafer alignment reference mark and an automatic alignment detection position in the field of the projection optical system, is precisely predetermined so that the distance through which the wafer is moved from the TV wafer alignment station to the automatic alignment position, is determined in accordance with the coordinate position of the TV wafer alignment mark.

The error in the position detection by the TV wafer alignment station is not more than plus and minus 5 microns. The total error including the error which may occur during the wafer stage movement from the TV wafer alignment station to the mask-wafer alignment station, is in the order of plus and minus 10 microns. Therefore, the fine alignment operation in the mask-wafer alignment station is required to be executed only within the range of approx. plus and minus 10 microns, which is less than 1–100 of the view field of a conventional alignment system. This makes it possible to effect the alignment operation at a higher speed than in conventional systems.

Figure 2:
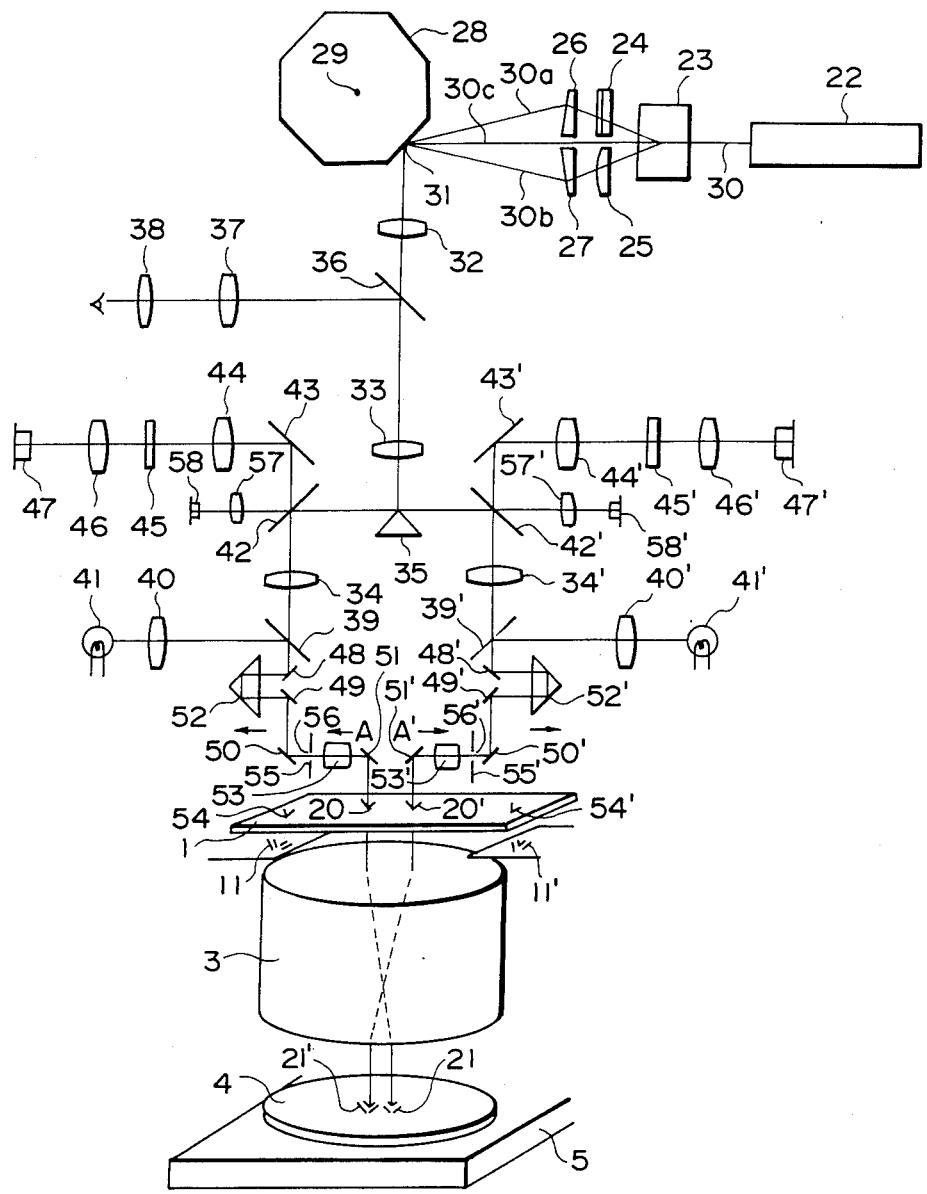
FIG. 2 illustrates an optical arrangement used in an alignment apparatus according to an embodiment of the present invention.

FIG. 2 illustrates an optical system for the alignment and exposure apparatus according to the embodiment of the present invention and shows the state of the optical system when it produces detection signals representative of the alignment marks on the mask 1 and wafer 4. The shown mask 1, reduction projection lens 3, wafer 4 and wafer stage 5 correspond to those elements shown in FIG. 1. The projection lens 3 is schematically shown for the sake of simplicity of explanation. Mask alignment marks 11 and 11' are formed at fixed positions, for example, on a lens barrel or a part of a frame of the apparatus.

Figure 3A:
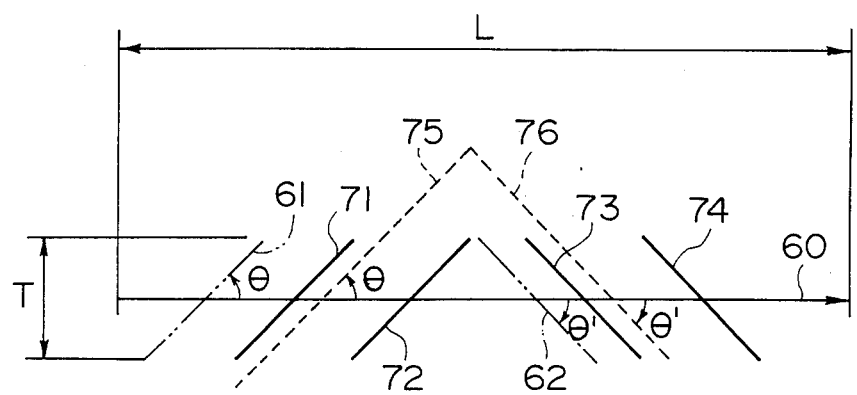
FIG. 3A illustrates an example of a set of alignment marks on a mask and a wafer used with an apparatus according to the embodiment of the present invention.

The mask 1 has at each of the positions shown by reference numerals 20 and 20' an alignment mark which is in the form of lines or slits 75 and 76 at an angle of 45 degrees with respect to a scanning line 60, as shown in FIG. 3A. Correspondingly, the wafer 4 has at each of the positions shown by reference numerals 21 and 21' an alignment mark which is in the form of lines or slits 71, 72, 73 and 74 extending at an angle of 45 degrees with respect to the scanning line 60 as shown in FIG. 3A. Usually the positional alignment is effected based on the signals provided by both of the left-hand and right-hand optical systems.

The alignment marks on the mask 1 and wafer 4, when a projection optical system which is not a unit magnification projection optical system is provided therebetween, are dimensioned such that one has the same size as the other when the one is projected therethrough to the other, whether the projection is in one direction or the other through the projection lens. Since, in this embodiment, a reduction projection lens 3 is employed, the value obtained by dividing the dimension of the mask alignment mark by that of the wafer alignment mark is equal to the magnification (reduction) of the reduction projection lens 3.

Referring back to FIG. 2, the optical system includes a laser generating source 22 and a beam deflector 23 in the form of an acoustooptic element or the like. The beam deflector 23 serves to change the direction of the beam horizontally and vertically in response to external changing signals. The beam is then passed through converging cylindrical lenses 24 and 25 which are so arranged that the generating lines thereof are orthogonal. The cylindrical lenses 24 and 25 are effective to convert the cross-section of the laser beam into a linear cross-section. After the cylindrical lens 24 and 25, there are provided trapezoidal prisms 26 and 27, which serve to refract the beam which has been vertically deflected by the beam deflector 23. There is further provided a polygonal mirror 28 which is rotatable about a shaft 29.

The laser beam 30 produced by the laser beam source 22 takes one of the following three optical paths depending on the state of the beam deflector 23. The first is the path for a slit cross-section beam 30a, extending through the cylindrical lens 24 and the prism 26; the second, the path for a slit cross-section beam 30b, extending through the cylindrical lens 25 and the prism 27; and the third is the path for a spot beam 30c, extending straight. The beam, by whichever path is taken, converges to the same position 31 on the surface of the polygonal mirror 28. The system further comprises an F-θ lens 32, intermediate lens 33 and 34, a beam splitter mirror 35 for dividing the optical path, a half-mirror 36 which directs the beam to an observation optical system comprising a lens 37, and an eye piece 38 for forming an image of the wafer 4 surface at the infinite distance. A half-mirror 39 serves to introduce light for observation from an observation illumination system comprising a lamp 41 and a condenser lens 40. Another half-mirror 42 is provided to direct the beam to a photoelectric detection system including a mirror 43, a lens 44, a spatial frequency filter 45 and a condenser lens 46. It further includes a photodetector 47 for detecting a signal representative of an alignment pattern, a lens 57 and a photodetector 58 for detecting a synchronization signal. There are provided further full-reflection mirrors 48, 49, 50 and 51, a prism 52 and a microscopic objective lens 53, the mask 1 is provided with a mask alignment pattern 54.

The foregoing explanation of FIG. 2 has been made only with respect to the left-hand part of the optical system, since the right-hand part is symmetric. The explanation thereof will be omitted for the sake of simplifity by giving the same reference numerals but with primes to the corresponding elements.

The f-θ lens 32 and the intermediate lenses 33 and 34 are arranged such that an image of the origin of the deflection by the polygonal mirror 28 is formed at the pupil 56 in the stop 55 of the objective lens 53. Therefore, the laser beam scans the mask 1 and wafer 4 in accordance with rotation the polygonal mirror.

In the objective lens optical system, the objective lens 53, the stop 55, mirror 51 and prism 52 are movable in the directions of X and Y by a moving means (not shown ) so that the position of observation or measurement for the mask 1 and wafer 4 can be changed. For example, during the movement in X direction, when the mirror 51 moves in the direction shown by arrow A, the objective lens 53 and the stop 55 also move in the direction of arrow A, while the prism 52 also moves in the same direction but angly one half of the movement of the mirror 51 to keep the optical path length constant at all times. During the movement in Y direction, on the other hand, the entire observation and position detection optical system moves in Y direction (perpendicular to the sheet of drawing).

Figure 3B:
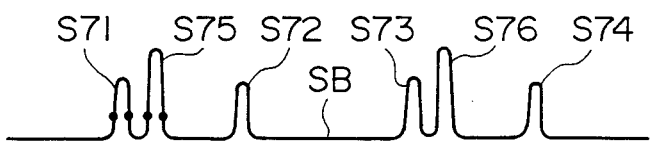
FIG. 3B shows a detection signal corresponding to the alignment mark of FIG. 3A.

The scanning beam 61 which has passed along the optical path 30a through the cylindrical lens 24, is incident to form an illumination area in the form of a line extending at an angle of 45 degree with respect to the scanning line 60, that is, extending parallel to the marks 71, 72 and 75 shown in FIG. 3A. Upon the scanning operation with this beam, signals S71, S75 and S72 are produced by the photodetectors 47 and 47', as shown in FIG. 3B. Those resultant signals S71, S75 and S72 correspond to the marks 71, 75 and 72, respectively. Even if there is a fine piece of dust on the surface being scanned, the influence thereof is much smaller than when it is scanned with spot-like beam, so that the dust is practically not detected.

On the other hand, the scanning beam 62 which has passed along the optical path 30b through the cylindrical lens 25 is incident to form an illumination line extending at an angle of −45 degrees (θ) with respect to the scanning line 60, so that it is parallel to the marks 73, 74 and 76. The detection signals are as shown in FIG. 3B by reference numerals S73, S76 and S74. The positional deviation or displacement between the mask 1 and wafer 4 can be determined by measuring the intervals between the detection signals S71, S75, S72, S73, S76 and S74. When they are corrected aligned, the intervals are equal.

It is added here that U.S. Pat. Nos. 4,167,677 and 4,199,219, which have been assigned to the assignee of the present application propose automatic alignment systems.

In the foregoing paragraphs, an alignment between the alignment mark 20 on the mask 1 and the alignment mark 21 on the wafer 4 has briefly be explained together with FIGS. 2, 3A, 3B and 3C.

Figure 3C:
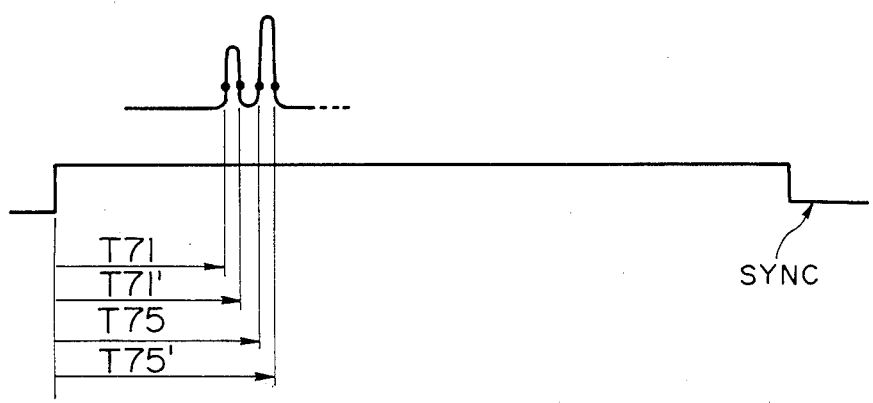
FIG. 3C shows a synchronization signal which is an output of a synchronization detecting circuit.
Figure 4A:
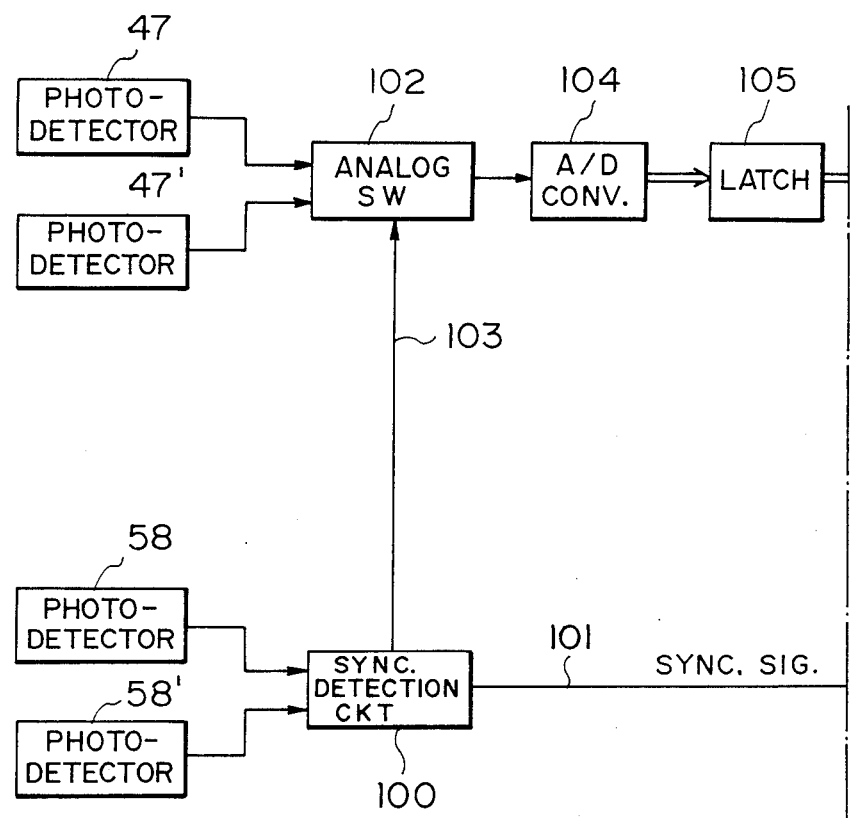
FIGS. 4A–4C are block diagrams of a position detecting circuit used with the embodiment of the present invention.
Figure 4:
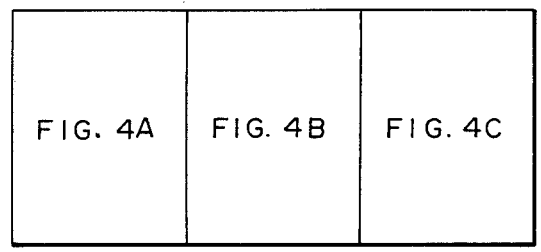
Figure 4B:
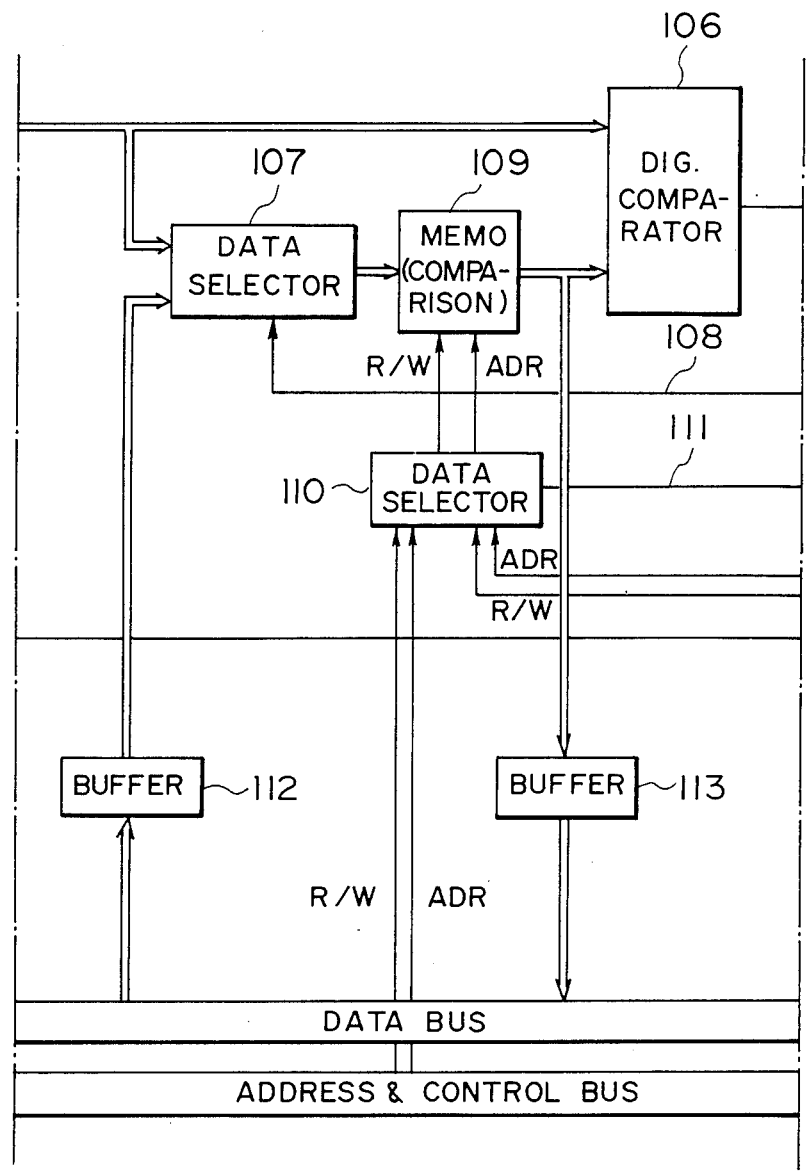
Figure 4C:
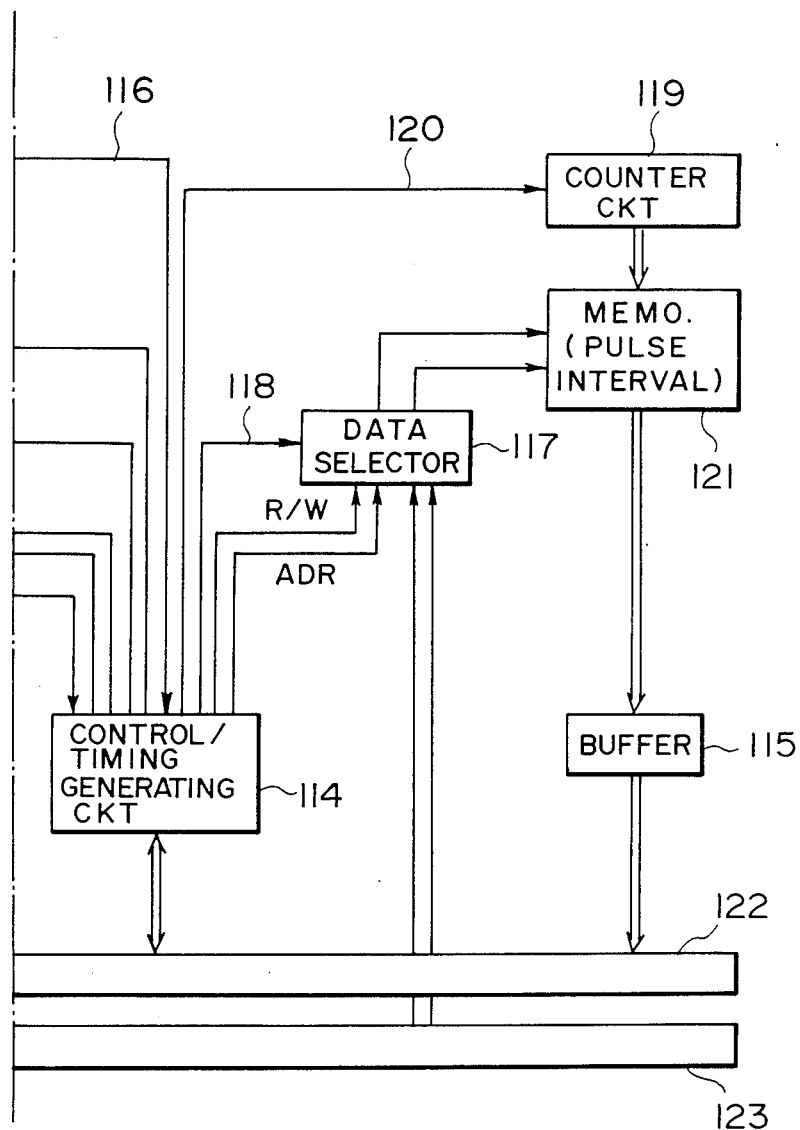

Next, the explanation will be made with respect to an alignment mark position detecting circuit usable with an alignment and exposure apparatus according to another embodiment of the present invention. FIG. 4 is a block diagram of the position detecting circuit according to the embodiment of the present invention. The photodetectors 47 and 47', as have been already described, serve to convert the light signal representative of the alignment mark to an electric signal. The photodetectors 58 and 58' convert, to an electric signal, the laser beam which is scanning the mask 1 and the wafer 4 to detect the timing of a scan. A synchronization detection circuit 100 functions to digitize and wave-reform the output signal of the photodetectors 58 and 58' and to produce a synchronization signal 101 and control signals 103 as shown in FIG. 3C. An analog switch 102 effects a switching operation in response to the control signal 103 and combine the output signals from the photodetectors 47 and 47' (FIG. 3B shows the output signals from the photodetector 47). An analog-digital converter 104 serves to convert the level of the analog signal of the analog switch 102 to an 8 bit length digital signal having a predetermined timing. A latch 105 temporaly stores the digital signal from the analog-digital converter 104. The A/D converter 104 and the latch 105 are controlled by timing signals (not shown) generated by a control/timing generating circuit 114 which will be described hereinafter.

A data selector 107 receives the output from a buffer 112 and the output of the latch 105 and sends out one of them in response to a selection signal 108 produced by the control/timing generating circuit 114. The buffer 112 is connected to a data bus 122 of a microprocessor (not shown). Designated by reference numeral 109 is a random access memory of 8 bits and 24 bites, which is controlled by a read/write signal (hereinafter simply called R/W signal) produced by the data selector 110 and an address signal (hereinafter called ADR signal). The random access memory 109 stores the output data of the data selector 107 at predetermined addresses and allows the data to be read out. An output signal of the data selector 110 (R/W signal and ADR signal) is either one of the output signal (R/W signal and ADR signal) of the control/timing generating circuit 114 and an output signal (R/W signal and ADR signal) of the microprocessor which is given through a address/control bus 123. The selection is made therebetween by a selection signal 111 produced by the control/timing generating circuit 114.

A digital comparator 106 compares the output data of the latch 105 and the data read out of the memory 109 and sends the result of the comparison to the control/timing generating circuit 114. The control/timing generating circuit 114 controls the data selectors 107 and 110 which have been described and a data selector 117 and a counter circuit 119 which will be described hereinafter, in response to the output signal 116 of the digital comparator 106, to the synchronization signal 101 of the synchronization detection circuit 100 and to an output data signal of a microcomputer given through the data bus 122. The counter circuit 119, which is an 16 bit counter, is controlled in its counting action by a clear signal sent from the control/timing generating circuit 114 through a signal line 120 and by a count enabling signal. A random access memory 121 of 16 bits and 24 words is controlled by the output signal (R/W signal and ADR signal) of the data selector 117 so that the count of the counting circuit 119 is written in at a proper address and that the data stored therein is read out. The output signal of the data selector 117 (R/W signal and ADR signal) is either one of the output signal (R/W signal and ADR signal) of the control/timing generating circuit 114 and the output signal (R/W signal and ADR signal) of a microprocessor given through the address and control bus 123. The selection therebetween is made by a selection signal 118 produced by the control/timing generating circuit 114. The outputs of the memory 109 and the memory 121 are sent to the data bus 122 through a buffer 113 and a buffer 115. Thus, the microprocessor is able to read out the data stored in the memories.

Figure 5A:
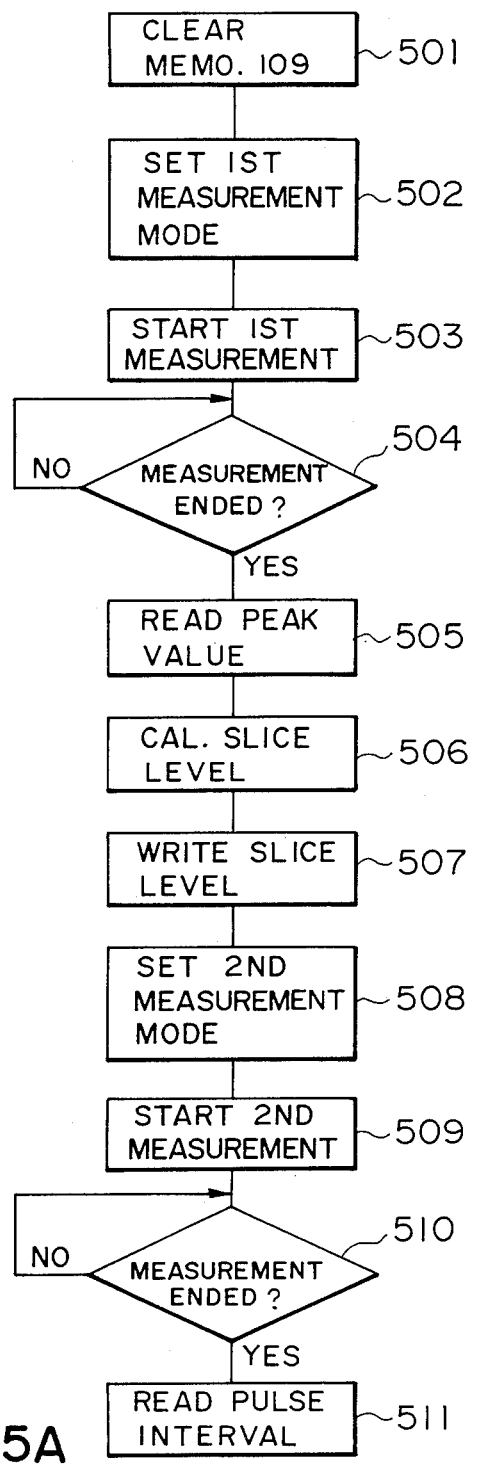
FIG. 5A is a flow chart showing a control sequence of a microprocessor for controlling the position detecting circuit of FIG. 4.
Figure 5B:
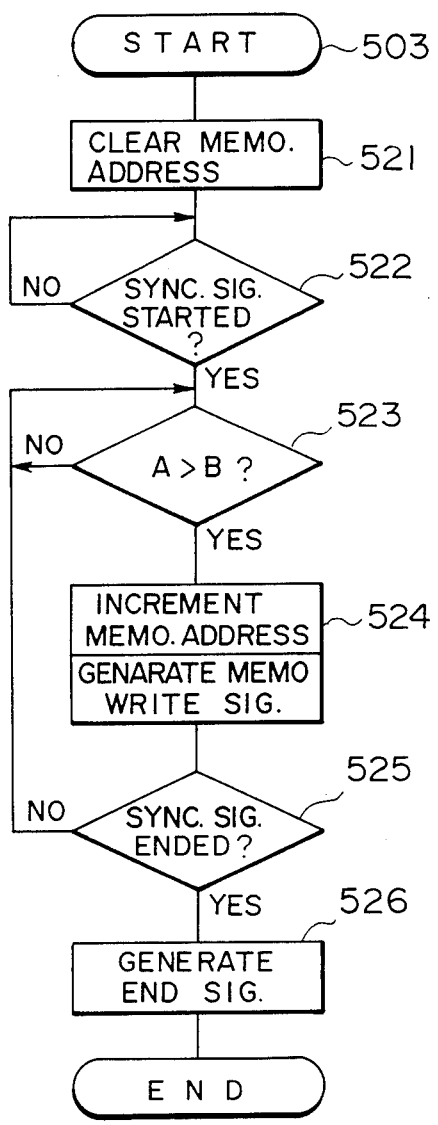
FIG. 5B is a flow chart showing further in detail an execution of a first measurement shown in FIG. 5A.
Figure 5C:
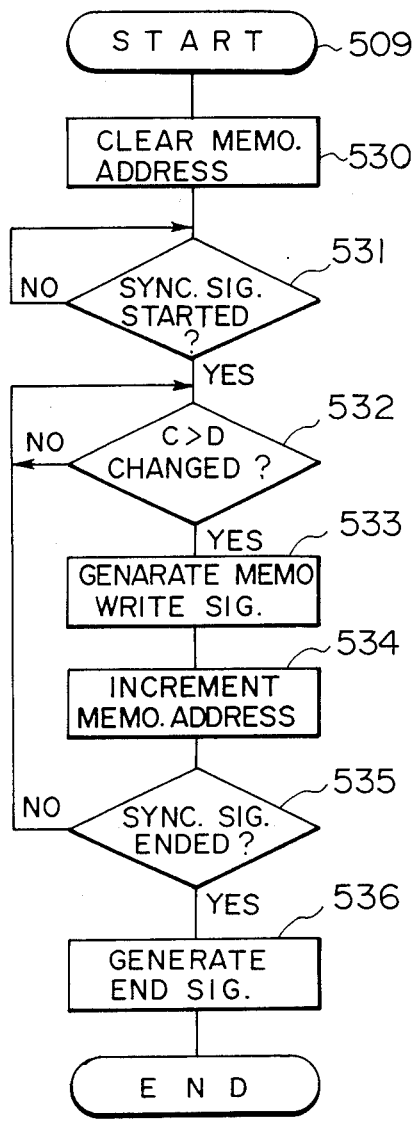
FIG. 5C is a flow chart showing further in detail an execution of a second measurement shown in FIG. 5A.

Operations of the position detecting circuit of the embodiment will now be described. FIG. 5A is a flow chart showing the control sequence of the microprocessor for controlling the position detecting circuit shown in FIG. 4. FIG. 5B is a flow chart for showing in detail a part of the sequence of FIG. 5A, that is, a first measurement. The first measurement is not under the control of the microprocessor but is executed by the hardware. Similarly, FIG. 5C is a flow chart showing in detail another part of the sequence shown in FIG. 5A, that is, a second measurement. The second measurement is not controlled by the microprocessor but is executed by the hardware. Here, the first measurement is intended to mean the measurement for detecting peaks of the detection signals representative of the alignment marks, and the second measurement is intended to mean the measurement of the pulse intervals between the alignment mark detection signals on the basis of a reference slice level which has been determined in consideration of the results of the first measurement. This will be further expalined.

First, memory 109 is cleared at step 501. The microprocessor controls the system such that the control/timing generating circuit 114 applies the selection signal 111 to the data selector 110, and that it applies the selection signal 108 to the data selector 107. In response thereto, the data selector 110 selects the address and conrol bus 123 of the microprocessor, and the data selector 107 selects the data bus 122 through the buffer 112. The memory 109 is directly accessed by the microprocessor so that zero is written in all storing areas of the memory 109, thus clearing it.

Then, a first measurement mode is set at step 502. The setting is accomplished by isolating the memory 109 from the control of the microprocessor and placing it under the control of the control/timing generating circuit 114. Namely, the microprocessor controls the control/timing generating circuit 114 such that the data selector 107 selects the output of the latch 105 and that the data selector 110 selects R/W signal and ADR signal of the control/timing generating circuit 114.

After the setting is completed, the microprocessor instructs the control/timing generating circuit 114 to execute the first measurement at step 503. The measurement operation is not under the control of the microprocessor but is performed by hardware, that is, under the control of the control/timing generating circuit 114.

Upon the completion of the measurement, the control/timing generating circuit 114 automatically informs the microprocessor of the completion.

The operation of the first measurement under the control of the control/timing generating circuit 114 will be explained in more detail in conjunction with FIG. 5B.

Upon the first measurement starting instructions being generated, an address counter (not shown) for the memory 109, provided in the control/timing generating circuit 114, is cleared so that the counter is set to the zero address at step 521, thus being prepared for the generation of the synchronization signal 101 (FIG. 3C) at step 522. When a leading edge of the synchronization signal is detected, the control/timing generating circuit 114 starts monitoring the output signal 116 of the digital comparator 106. If the output data of the latch 105 (hereinafter also called "A") is larger than the data read out of a predetermined address of the memory 109 (hereinafter also called "B"), that is, $A>B$, the control/timing generating circuit 114 increments by one the address counter for the memory 109 therein in response to the output signal 116 of the digital comparator 106 showing the above result of comparison. Simultaneously, the ADR signal and R/W signal (write-in signal) for the address are sent to the memory 109 so that the output data of the latch 105 is written in the memory 109 at step 524. These comparison (step 523) and memory writing (step 524) operations are repeated each time the data is output from the latch 105 until the end of the synchronization signal 101 (step 525). The contents of the memory 109 which were all zero at the start time are changed, each time the data larger than the data stored therein is detected, to the larger data. The address counter for the memory 109 is a twenty-three-notation (23) counter, the data larger than the data in the memory indicated by the address counter sequentially replace it, so that, upon the completion of the scanning operation, larger data is stored in the memory 109, including maximum values.

At step 525, the synchronization signal ends, that is, the alignment mark scanning operation terminates the control/timing generating circuit 114 sends an end signal to the microprocessor. This is the end of the first measurement (step 526).

Referring back to FIG. 5A, the microprocessor, in response to the end signal of the first measurement, proceeds to the next step, that is, step 505. The microprocessor accesses the control/timing generating circuit 114 to place the memory 109 under the control of the microprocessor. The microprocessor reads the peak data from the memory 109 and obtains an average thereof, from which the microprocessor calcutates a slice level (steps 505 and 506). Generally, it is preferable that the slice level is 20–50% of the average of the peak data. The thus obtained slice level is written in the memory 109 at a predetermined address (step 507).

Then, the second measurement mode is set (step 508). Similarly to the first mode measurement setting, the memory 109 is isolated from the control of the microprocessor and is put under the control of the control/timing generating circuit 114. Upon the completion of the setting operation, the microprocessor instructs the control/timing generating circuit 114 to execute the second measurement instruction to start the measurement (step 509). In response to the instructions, an address counter (not shown) for the memory 121, which is provided in the control/timing generating circuit 114, is cleared (step 530).

The operation of the second measurement will be expalined in more detail in conjunction with FIG. 5C. When the measurement start instruction signal is generated at step 509, the control/timing generating circuit 114 starts to detect the leading edge of the synchronization signal. When the leading edge is detected, the measurement operation starts.

During the second measurement operation, the data of the alignment mark detection signal is compared with the slice level stored in the memory 109 to detect the instance when the slice level is exceeded is determined.

The output data of the latch 105 (hereinafter also called "C") is compared with the slice level data (hereinafter also called "D") read out of the memory 109 by the digital comparator 106. The above decribed exceeding is detected at the instance when the state of $C \leq D$ is changed to the state of $C > D$ or when $C > D$ is changed to $C \leq D$, as a result of the comparison. This corresponds to detecting the leading and trailing edges of the comparison signal in the hardware.

The time of the exceeding is determined by counting timing clock pulses generated within the control/timing generating circuit 114. The start of the counting is the leading edge of the synchronization signal 101, from which the counter circuit 119 counts the timing clock pulses. Therefore, when the change in the results of the comparison between C and D is detected at step 532, the control/timing generating circuit 114 outputs a write signal to the memory 121 at step 533. The data written in the memory 121 at this time is the output of the counter circuit 119, and therefore, corresponds to the time period from the starts of the synchronization signal. This is the time interval data corresponding to that shown in FIG. 3C by reference characters T71. When the data is written in the memory 121, the memory address counter (not shown) is incremented at step 534. These operations are repeated until the end of the synchronization signal at step 535. Thus, in the memory 121, there is stored from the zero address the data T71, T71′, T75, T75′ . . . (FIG. 3C). When the synchronization signal ends, and the scanning operation also ends, the second measurement operation terminates, so that an end signal is produced at step 536.

Referring back again to FIG. 5A, the end of the measurement is detected at step 510, and at step 511 the microprocessor selects the memory 121 to read the data thereof. In this manner, the intervals between the marks which are shown in FIG. 3 are measured.

Figure 6:
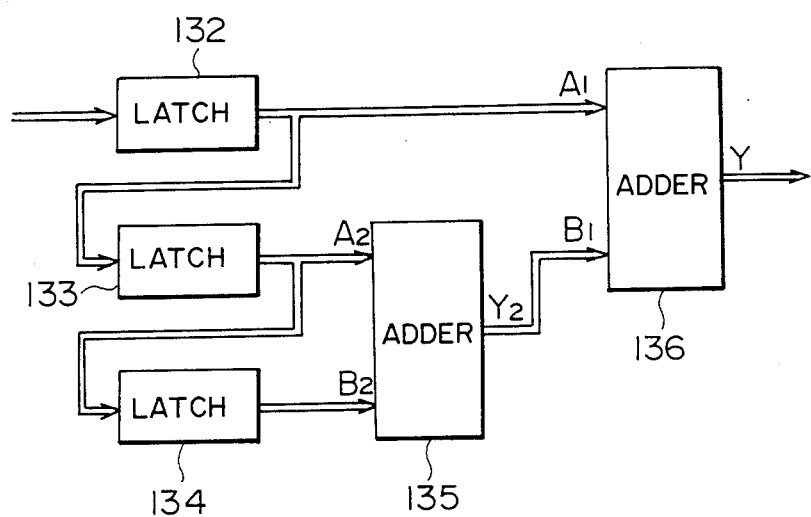
FIG. 6 is a block diagram of a main portion of another embodiment of the present invention.

FIG. 6 shows a circuit for adding plural sampling data adjacent to each other, according to an embodiment of the present invention. The circuit shown in FIG. 6 can replace the latch 105 of FIG. 4. The circuit of FIG. 6 is effective to make a waveform smoother so as to eliminate noises from the alignment mark detection signal. The waveform of the detection signal is generally like the one shown in FIG. 3B, but actually it contains noise. More particularly, a base line SB actually contains power source noise, laser noise, or the like so that it is not flat. Also, the signal does not linearly up from the base line SB to the peak of the signal e.g. S71, but has some noise superposed thereon.

As shown in FIG. 6, which is a block diagram for the circuit for eliminating the above described noise, the circuit includes latches 132, 133 and 134 and adders 135 and 136: The operation will be described. The data digitized by the A/D converter 104 (FIG. 4) is introduced to the first latch 132. The output of the first latch 132 is received by an input port $A_1$ of the first adder 136 and by the input portion of the second latch 133. In like manner, the output of the second latch 133 is received by an input port $A_2$ of the adder 135 and by the input portion of the third latch 134. The output of the third latch 134 is sent to an input port $B_2$ of the second adder 135. The output $Y_2$ of the second adder 135 is received by the first adder 136, which produces an output $Y_1$, which in turn is received by the digital comparator 106. The latches 132, 133 and 134 are operated by a common clock, and operated at the same clock cycle as that of the conversion timing of the A/D converter 104, although the phase may be different. For this reason, the output data of the A/D converter 104 is sequentially transferred to the first latch 132, the second latch 133 and the third latch 134.

TABLE 1

|  | CLOCK CYCLE | | |
|---|---|---|---|
|  | TN | TN+1 | TN−1 |
| OUTPUT OF A/D CONVERTER (104) | DN | DN+1 | DN+2 |
| OUTPUT OF 1ST LATCH (132) | DN−1 | DN | DN+1 |
| OUTPUT OF 2ND LATCH (133) | DN−2 | DN−1 | DN |
| OUTPUT OF 3RD LATCH (134) | DN−3 | DN−2 | DN−1 |
| OUTPUT OF 1ST ADDER (136) | DN−1 + DN−2 + DN−3 | DN + DN−1 + DN−2 | DN+1 + DN + DN−1 |

Table 1 shows a flow of the data in response to the clock cycle for the purpose of explaining the operation of the circuit of FIG. 6. Referring to the Table, the output data DN is produced by the A/D converter 104 at the clock cycle TN. from the first latch 132, the second latch 133, and the third latch 134, the data DN−1 and DN−2 and DN−3 are output. Here, DN−1 is data obtained at the clock cycle TN−1 which is immediately before the clock cycle TN; DN−2 is data obtained at the clock cycle TN−2 which is immediately before the clock cycle TN−1; and DN−3 is data obtained at the clock cycle TN−3 which is immediately before the clock cycle TN−2. Therefore, the output $Y_1$ of the first adder 136 is a sum of the data DN−1, DN−2 and DN−3. In the next clock cycle, it is the sum of the data DN, DN−1 and DN−2; and in the subsequent clock cycle it is a sum of the data of DN+1, DN, DN−1. Therefore, even if the data DN obtained at the clock cycle TN incidentally contained a noise $\Delta D$ and is actually $DN' = DN + \Delta D$, the resultant data becomes diluted or qualified by the adjacent data DN+1 and DN−1, with the result that a possible erroneous operation of the comparator 106 is prevented.

The description has been made as employing three portions of data to be added, but the amount of data to be added is not limiting.

FIG. 7 shows another embodiment of the present invention, wherein reference numerals 47, 47′, 58 and 58′ are the photodetectors as described in the foregoing embodiment with the same reference numerals. The circuits 100, 102 and 104 and the signals 101 and 103 are the same as those described hereinbefore with the same reference numerals.

An adder 150 includes an input port A of 8 bit length, an input port B of 16 bit length and an output port Y of 16 bit length. The adder 150 functions to add the output data (A) of the latch 105 and the output data (B) of the latch 153 and send the result to the latch 151. A random access memory 152 of 16 bits×4K words is controlled in addressing, reading and writing by an output ($Y_0$ and $Y_1$) of a data selector 154. The output of the memory 152 is introduced to the latch 153, which produces an output to be received by the port B of the adder 150.

The input and the output of the memory 152 are connected through buffers 157 and 158 to a data bus 122 of a microprocessor (not shown).

A data selector 154 produces an output signal (R/W signal and ADR signal) which is either one of an output signal of a control circuit 155 (R/W signal and ADR signal) and an output signal (R/W signal and ADR signal) given from the microprocessor through an address and control bus 123. The selection therebetween is made by a selection signal 156 produced by the control circuit 155. The selection signal 156 is controlled by the microprocessor.

Figure 8A:
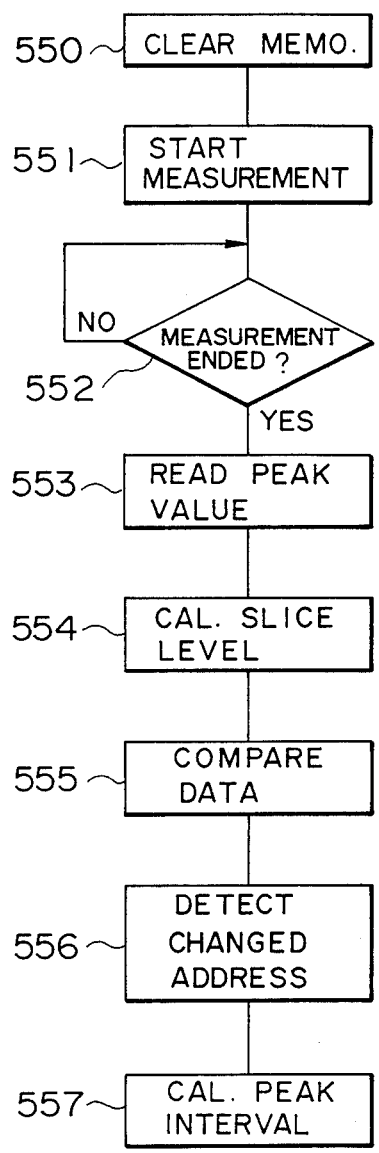
FIG. 8A is a flow chart showing a control sequence of a microprocessor for controlling the position detecting circuit of FIG. 7.
Figure 8B:
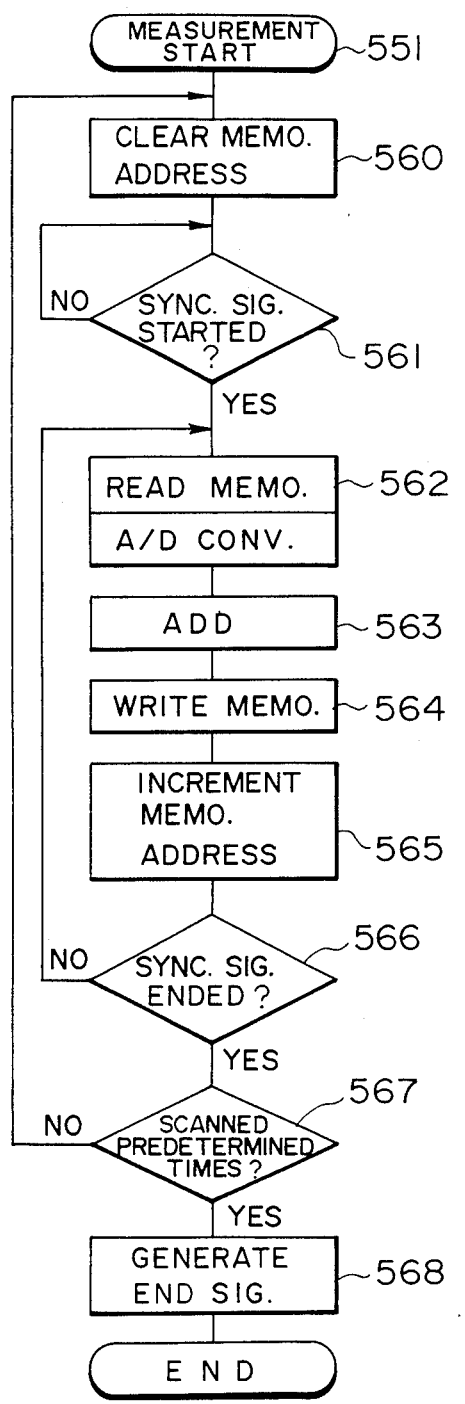
FIG. 8B is a flow chart showing further in detail an execution of the measurement shown in FIG. 8A.

The operation of this embodiment will now be descrbed. FIG. 8A is a flow chart showing a sequential operation of the microprocessor for controlling the position detecting circuit shown in FIG. 7. FIG. 8B is a flow chart which shows in more detail a part of the sequence of FIG. 8A, that is, the measurement operation thereof. The measurement operation is not under the control of the microprocessor, but is executed by hardware. In the operation, memory 152 is cleared (step 550). The microprocessor controls such that the control circuit 155 sends the selection signal 156 to the data selector 154. By this, the data selector 154 selects the address and control bus 123 of the microprocesosr. The memory 152 is directly accessed by the microprocessor so that all of the storing areas of the memory 152 is cleared by writing zero therein.

At step 551, a measurement start instruction is given to the control circuit 155, thus making it ready for the end of the measurement at step 552. The measurement is carried out not under the control of the microprocessor but under the control of the control circuit 155 by hardware.

The explanation of the measurement operation will be made together with FIG. 8B. At step 560 which is after the start of measurement at step 551, an address counter (not shown) provided within the control circuit 155 is cleared.

Then, when a synchronization signal is detected at step 561, the data at 0 address of the memory, which is 0 because it has been cleared, is read at step 562, and simultaneously, the light signal is digitalized by the A/D converter 104 in response to a first sampling signal. Those two data signals are received and added by the adder 150 at the same time through the latches 105 and 153, respectively, at step 563. The sum is written in the memory 152 via. the latch 151 (step 564), and the address counter for memory 152 is incremented by 1 at step 565.

The light signals digitalized by the next timing signal is stored at address 1 of the memory 152 in accordance with the instructions of the address counter.

These operations are repeated with the result that each of the digital data for the light signals covering one scan is sequentially stored at the predetermined addresses. These operations are continued until the end of the synchronization signal (steps 562 to 567). The address 4K and the number of words of the memory is predetermined on the basis of the length of the synchronization signal and the sampling interval of A/D converter 104 in such a manner that the data stored addresses does not exceed 4095 (4K) prior to the termination of the synchronization signal.

The scanning operation is repeated until the number thereof reaches a predetermined number (steps 560 to 567). The number of the scanning operations is determined on the basis of the accuracy required. The interrelation between the required accuracy and the number of scanning orations is disclosed in Japanese patent application No. 208765/1982. When the predetermined number of measurements is accomplished, the control circuit 155 sends a signal to the microprocessor at step 568, and this is the end of the measurement. At the end of the measurement, the memory 152 contains the digital data representative of a waveform which corresponds to the sum of the scanned number of the waveforms each as shown in FIG. 3B. Referring back to FIG. 8A, after the termination of the measurement, the microprocessor accesses the memory 152 at step 553 and searches the peak data within the memory 152, and then calculates a slice level from those peak data at step 554. It, then, compares the data in the memory 152 with the slice level. The results of the comparison are again written in the memory 152 in the form, for example, of data "0" (when the data in the memory is smaller than the slice level) and "1" (when the data in the memory is larger than the slice level). The comparison operations are carried out over the address 0 through the address 4095. Subsequently, at step 556, the address is searched where the stored data changes from "0" to "1", or from "1" to "0". The searched address corresponds to the detection of the light signal, that is, corresponds to the point T71, T71', T75, T75' . . . By calculating the intervals between the marks from the addresses determined in the above described manner, the intervals between the marks can be determined (step 557).

As described in the foregoing, according to the embodiments of the present invention, the slice level is automatically determined in accordance with the peak values of the actual alignment mark signals. Therefore, the possible overlooking of the alignment mark signal is prevented, and simultaneously, it is not necessary to manually modify the slice level. In addition, the number of scanning operations for measurement can be selected in accordance with the needed accuracy of positioning, thus making the operations more efficient.

Figure 9A:
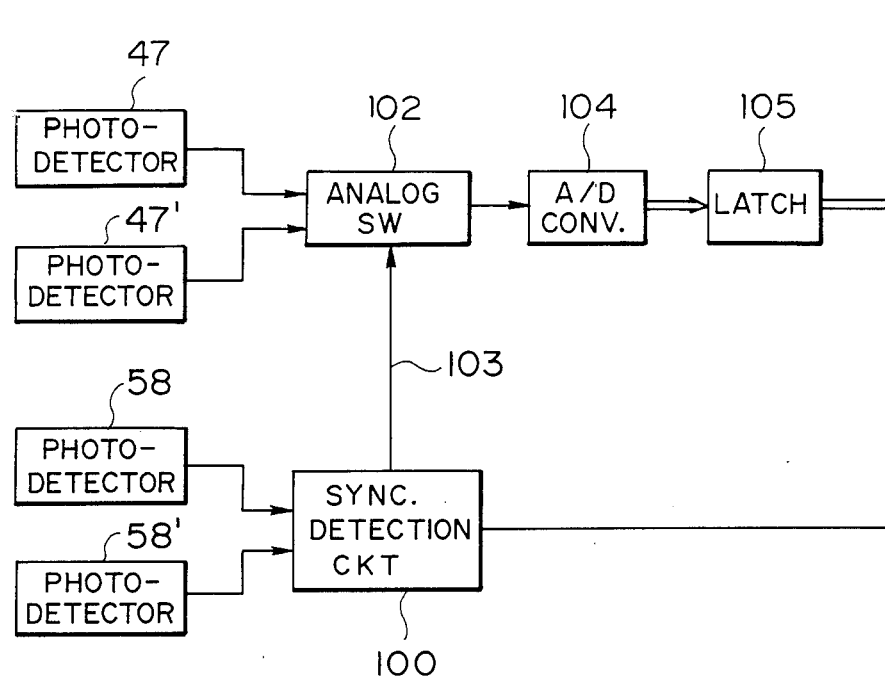
FIGS. 9, and 9A–9D are a block diagram of a position detecting circuit.
Figure 9:
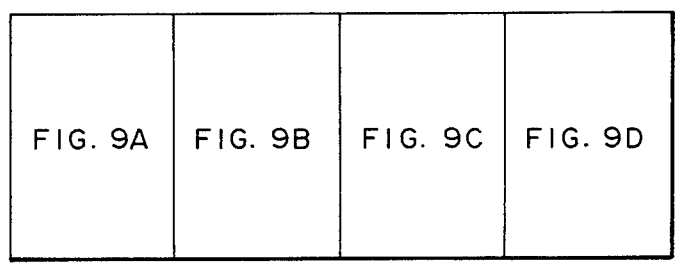
Figure 9B:
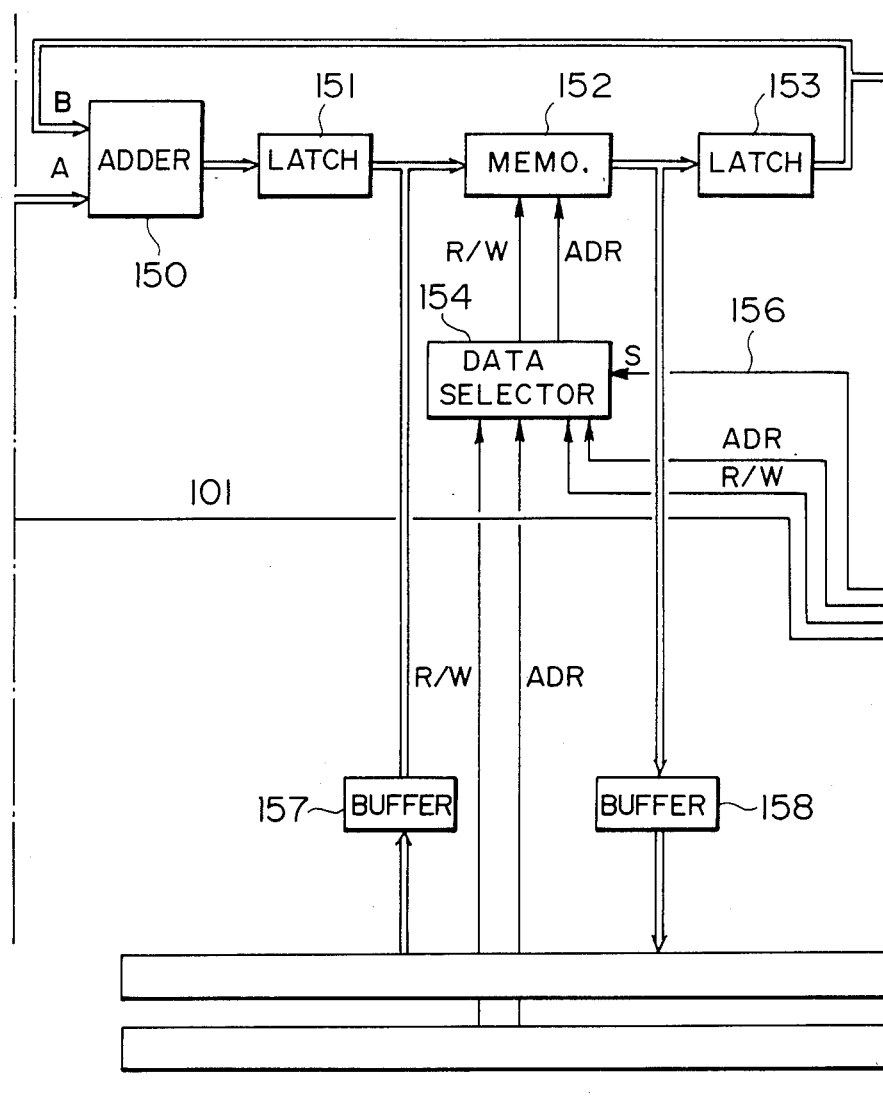
Figure 9C:
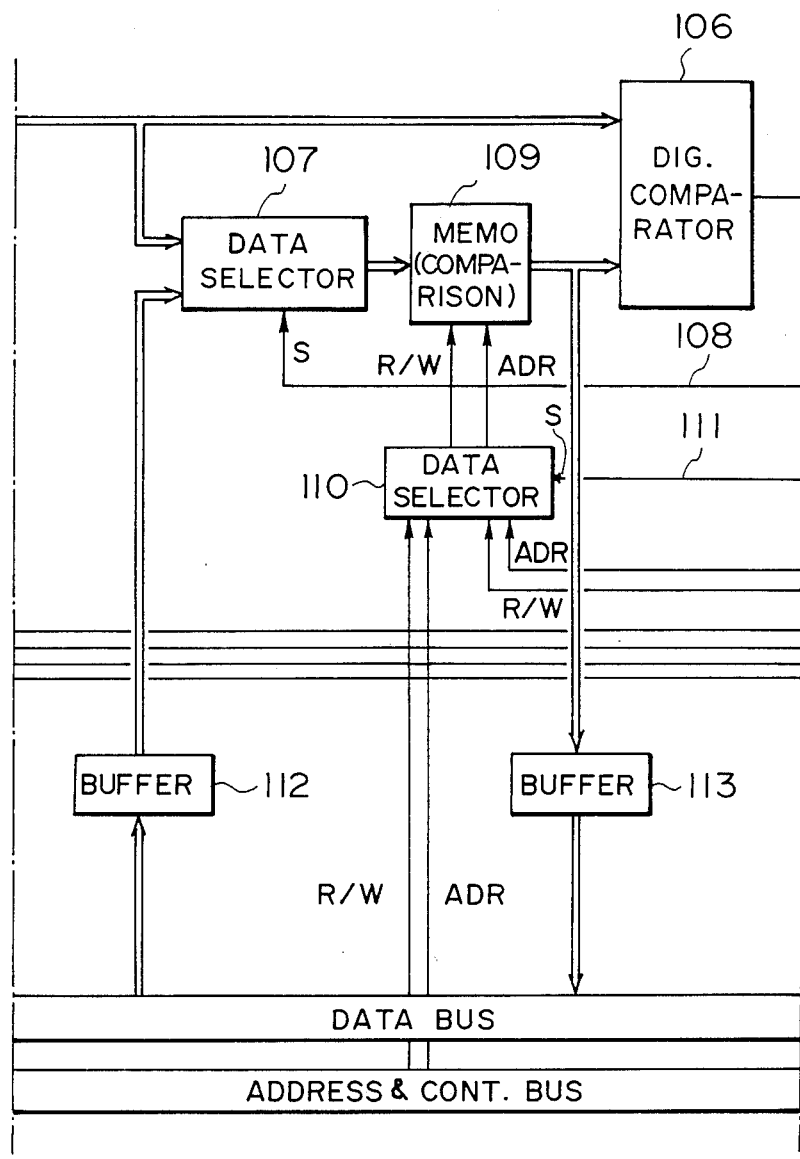
Figure 9D:
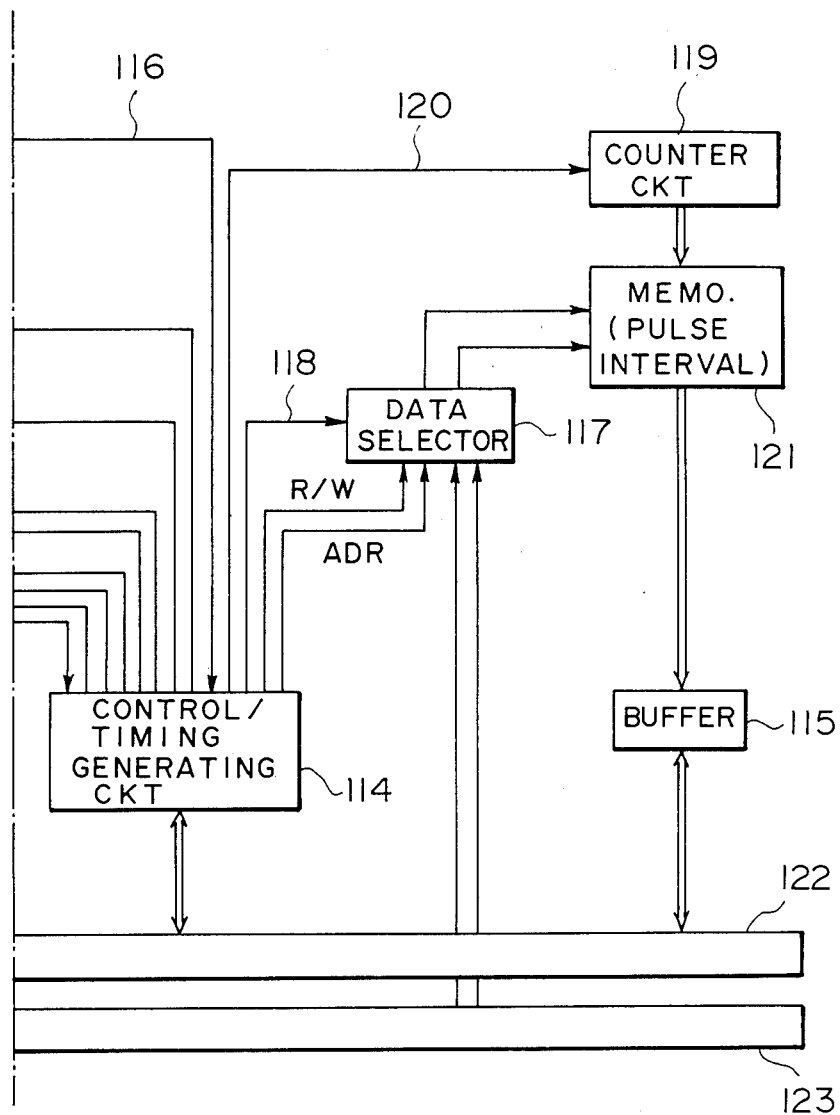

FIG. 9 shows another embodiment. In this embodiment the same reference numerals are assigned to the elements having the corresponding functions of those in the FIGS. 4 and 7 embodiments. However, the data selector 107 in FIG. 4 selects either one of the output of the buffer 112 and the output of the latch 105, whereas in this embodiment it selects either one of the output of the buffer 112 and the output of the latch 153. Additionally, although in FIG. 7 the data selector 154 is controlled by the selection signal 156 of the control circuit 155, it is controlled in this embodiment by the output from the control/timing generating circuit 114.

Figure 10A:
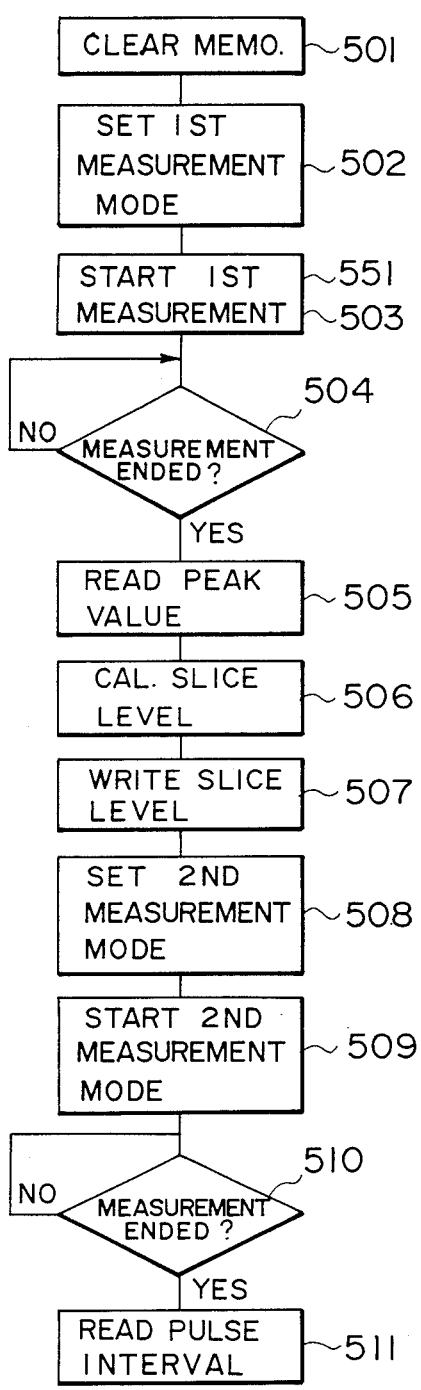
FIG. 10A is a flow chart showing a control sequence of a microprocessor for controlling the position detecting circuit of FIG. 4.
Figure 10B:
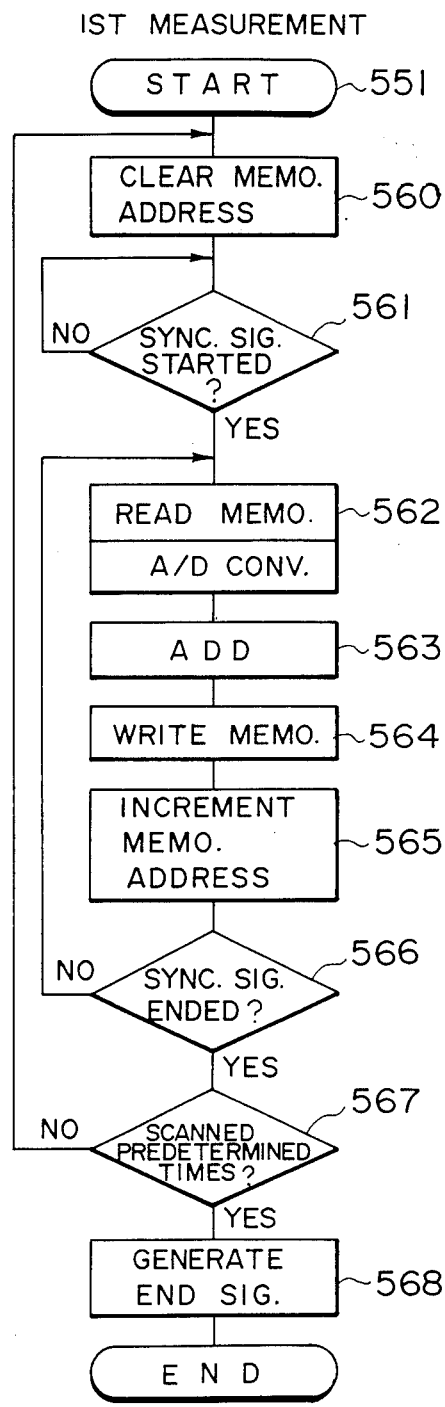
FIGS. 10B and 10C are flow charts showing further in detail an execution of the first measurement shown in FIG. 10A.
Figure 10C:
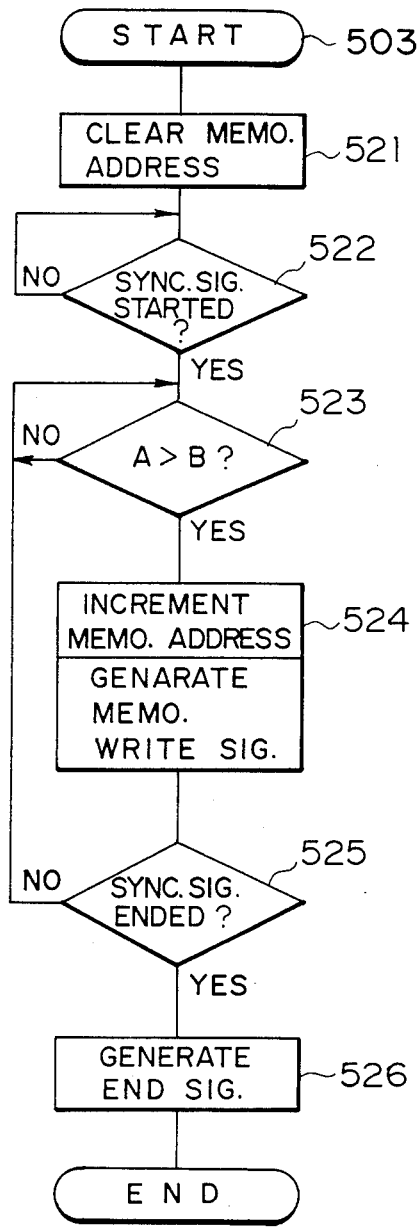
Figure 10D:
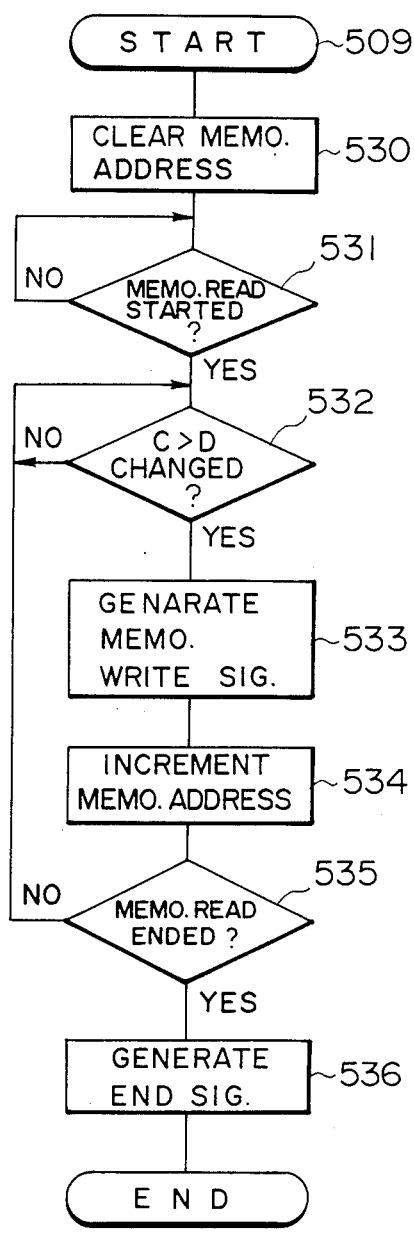
FIG. 10D is a flow chart showing further in detail an execution of a second measurement.

FIG. 10A is a flow chart showing a control sequence of the microprocessor for controlling the position detecting circuit of FIG. 9, FIGS. 10B and 10C are flow charts showing in further detail execution of a first measurement shown in FIG. 10A. The execution of the first measurement is not under the control of the microprocessor, but is made by hardware. Similarly, FIG. 10D is a flow chart showing further in detail the execution of the second measurement shown in FIG. 10A. The second measurement is not executed under the control of the microprocessor, but is executed by hardware.

Here, the first measurement is the process for superposing or adding the light signals digitized and the simultaneous process for detecting peaks. The second measurement means the measurement of the pulse intervals between the alignment mark detection signals, using a reference slice level obtained from the peaks determined by the first measurement.

In operation, the memories 109 and 152 are cleared at step 501. Then, the first measurement mode is set (step 502). The microprocessor controls the control/timing generating circuit 114, such that the data selector 107 selects the output of the latch 153 and that the data selector 110 selects the ADR signal and R/W signal supplied by the control/timing generating circuit 114.

The microprocessor also controls the control/timing generating circuit 114, such that the memory 152 selects the output of the latch 151 and that the data selector 154 selects the ADR signal and R/W signal supplied by the control/timing generating circuit 114.

Upon the completion of the setting, the microprocessor instructs the control/timing generating circuit 114 to start the first measurement, so that the measurement starts (step 503 and step 551). The sequence of the first measurement is shown in FIGS. 10B and 10C. As shown in FIG. 10B, after the start of measurement an address counter (not shown) for the memory 152, provided in the control/timing generating circuit 114, is cleared at step 560. Then, an adding process is effected in the same manner as described with respect to FIG. 8B.

When a predetermined number of measurements are accomplished, the control/timing generating circuit 114 send to the microprocessor an end signal at step 568, thus terminating the measurement. At the end of the measurement, the memory 152 contains the digital data representative of the waveform corresponding to a sum of the scanned number of waveforms each as shown in FIG. 3B.

The peak detection process, which is executed contemporaneously with the adding process, will be explained in conjunction with the flow chart shown in FIG. 10C.

When the microprocessor produces the first measurement start signal, an address counter (not shown) for the memory 109, provided within the control/timing generating circuit 114, is cleared, so that the counter is set to "0" address (step 521). Thus, it becomes ready for the synchronization signal 101 generation (FIG. 3C) at step 552. Upon detection of the leading edge of the synchronization signal 101, the control/timing generating circuit 114 starts to monitor the output signal 116 of the comparator 106. When the output data of the latch 153 (hereinafter also called "A") is larger than the data read out of an address of the memory 109 (hereinafter also called "B"), that is, A>B, the control/timing generating circuit 114, in response to the output signal 116 of the digital comparator 106 representative of the above comparison result, increments by one the address counter for the memory 109. At the same time, the ADR signal and R/W signal for this address is sent to the memory 109, and the output data of the latch 153 is written in the memory 109 (step 524). The comparison (step 523) and memory writing (step 524) operations are continued each time of the added data being output from the latch 105 until the synchronization signal 101 terminates (step 525). Therefore, the contents of the memory 109, which was zero at the start, is changed, each time of the detection of the data larger than the data within the memory, to the larger data. The address counter for the memory 109 is a twenty-three (23) notation or system counter. The data, if it is larger than the data in the memory at the address indicated by the address counter, replaces the data in the memory. At the end of the scanning operation, 24 larger data are stored in the memory 109, including the maximum.

When the synchronization signal 101 ends at step 525 (termination of the scanning operation for the alignment mark), the control/timing generating circuit 114 supplies the end signal to the microprocessor. This is the end of the first measurement (step 526).

Referring back to FIG. 10A, after receiving the first measurement end signal, the microprocessor proceeds to the next step, step 505. The microprocessor accesses the control/timing generating circuit 114, so that the memory 109 is put under the control of the microprocessor.

The microprocessor reads the 24 peak data of the memory 109, and calculates a slice level on the basis of the average (steps 505 and 506). Generally, the slice level preferably 20–50% of the average of the peak data. The thus obtained slice level is written in each of the addresses of the memory 109 (step 507).

Subsequently, the second measurement mode is set (step 508). Similarly to the first measurement mode setting, the memories 109 and 152 are isolated from the microprocessor control and is placed under the control of the control/timing generating circuit 114. After the setting is accomplished, the microprocessor supplies to the control/timing generating circuit 114 the second measurement start instructions, thus initiating the measurement (step 509).

The sequence of the second measurement will be explained together with FIG. 10D. Upon the generation of the measurement start instructions at step 509, the control/timing generating circuit 114 enter the detection step for the synchronization signal 101 (step 531), upon detection of which the measurement operations are executed. Also, in response to the measurement start instructions, the address counter (not shown) for the memory 121, which is within the control/timing generating circuit 114, is cleared (step 530). During the second measurement operation, the added data stored in the memory 152 is compared with the slice level set in the memory 109, to determine the instance when the slice level is exceeded.

The added data produced through the latch 153 from the memory 152 (hereinafter also called as "C") is compared with the slice level data read out of the memory 109 (hereinafter also called "D") by the digital comparator 106 for each address. The above described exceeding of the slice level means the change from $C \leq D$ to $C>D$, or the change from $C>D$ to $C \leq D$. This corresponds to the detection of the leading and trailing edges of the signal obtained as a result of the above described comparison, in hardware.

The time when the slice level is exceeded can be determined by counting timing clock pulses generated in the control/timing generating circuit 114. More particularly, the timing clock pulses are counted by the counter circuit 119 from the start of leading of the memory 152. When the change from the state of $C>D$ is detected at step 532, the control/timing generating circuit 114 sends to the memory 121 a writing signal at step 533. At this time, the data written in the memory 121 is the output of the counter circuit 119, and corresponds to the time measured from the reading-out of the memory 152. Further, this corresponds to time interval data shown by reference numeral T71 in FIG. 3C.

In the foregoing explanation of this embodiment, the adding process and the peak detection process of FIG. 10C are carried out contemporaneously during the first measurement step 551. However, it is a possible alternative that only the adding process is effected during the first measurement operation, and after the measurement operation is acomplished, the microcomputer, at step 505, accesses the memory 152 and searches the peak data in a memory 152, and at step 506, calculates the slice level from the peak data, whereafter at step 507, the slice level obtained is written in the memory 152.

Also, the embodiment has been described as being the position detecting circuit including the adding process. However, it is possible not to include the adding process, that is, the position detecting circuits may determine the position on the basis of the light signal data provided by only one scan.

While the invention has been described with reference to the structures disclosed herein, it is not confined to the details set forth and this application is intended to cover such modifications or changes as may come within the purposes of the improvements or the scope of the following claims.

What is claimed is:

1. An apparatus for aligning two objects in a predetermined relationship using alignment marks, comprising:
   means for producing a beam used to illuminate the alignment marks;
   means for detecting an area on which the beam impinges;
   means for effecting scanning by relative movement between the beam and the alignment marks;
   means for sequentially converting analog data produced by said detecting means in accordance with the scanning to digital data at predetermined intervals, while the scanning is being effected; and
   means for processing the digital data from said converting means to align the two objects, wherein said processing means includes a first memory for storing data corresponding to a peak of the analog data among the digital data of said converting means upon completion of the scanning deflection.

2. An apparatus according to claim 1, wherein said processing means includes a memory for storing digital data and a comparator for comparing the digital data from said converting means with corresponding digital data stored in said memory.

3. An apparatus according to claim 2, wherein said comparator is effective to store data having a larger value as a result of the comparison.

4. An apparatus according to claim 3, wherein said memory stores, upon completion of the scanning deflection, the digital data of said converting means which corresponds to a peak of the analog data.

5. An apparatus according to claim 4, wherein said processing means determines, on the basis of the digital data in said memory upon completion of the first scanning deflection, a level for extracting from the digital data from said converting means the data corresponding to said alignment marks.

6. An apparatus according to claim 2, wherein said processing means adds plural digital data of the digital data from said converting means which are in a predetermined relation, and said processing means comprises a second memory for sequentially applying said added plural digital data to said comparator.

7. An apparatus according to claim 1, wherein said processing means includes a memory for storing in different addresses the digital data from said converter means.

8. An apparatus according to claim 1, wherein said processing means determines the position of the alignment marks on the basis of the digital data corresponding to the peak of the analog data in said memory after completion of plural scanning deflections.

9. An apparatus according to claim 1, wherein said processing means includes a second memory and determines a level for extracting data corresponding to the alignment marks from the digital data in said second memory on the basis of the digital data in said first memory.

* * * * *

UNITED STATES PATENT AND TRADEMARK OFFICE
CERTIFICATE OF CORRECTION

PATENT NO. : 4,713,784

DATED : December 15, 1987

INVENTOR(S) : NAOKI AYATA

It is certified that error appears in the above-identified patent and that said Letters Patent is hereby corrected as shown below:

IN THE DRAWINGS:

Sheet 8, Fig. 5B, in box "524", "GENARATE" should read --GENERATE--.
Sheet 8, Fig. 5C, in box "533", "GENARATE" should read --GENERATE--.
Sheet 18, Fig. 10C, in box "524", "GENARATE" should read --GENERATE--.
Sheet 18, Fig. 10D, in box "533", "GENARATE" should read --GENERATE--.

COLUMN 3

Line 39, "convey" should read --conveys--.

COLUMN 4

Line 50, "lens" should read --lenses--.
Line 66, "lens" (second occurrence) should read --lenses--.

COLUMN 5

Lines 19-20, "simplifity" should read --simplicity--.
Line 27, "rotation" should read --rotation by--.
Line 46, "45 degree" should read --45 degrees--.
Line 67, "corrected" should read --correctly--.

UNITED STATES PATENT AND TRADEMARK OFFICE
CERTIFICATE OF CORRECTION

PATENT NO. : 4,713,784

DATED : December 15, 1987

INVENTOR(S) : NAOKI AYATA

It is certified that error appears in the above-identified patent and that said Letters Patent is hereby corrected as shown below:

COLUMN 6

Line 7, "be" should read --been--.
Line 26, "combine" should read --combines--.
Lines 31-32, "temporaly" should read --temporarily--.
Line 54, "a" should read --an--.

COLUMN 7

Line 1, "an" should read --a--.
Line 42, "expalined." should read --explained--.
Line 49, "conrol" should read --control--.

COLUMN 8

Line 39, "larger" should read --the larger--.
Line 42, "terminates the" should read --terminates and the--.
Line 54, "calcutates" should read --calculates--.

COLUMN 9

Line 4, "expalined" should read --explained--.
Line 34, "starts" should read --start--.
Line 56, "noises" should read --noise--.
Line 61, "up" should read --go up--.

COLUMN 10

Line 37, "from" should read --From--.

UNITED STATES PATENT AND TRADEMARK OFFICE
CERTIFICATE OF CORRECTION

PATENT NO. : 4,713,784

DATED : December 15, 1987

INVENTOR(S) : NAOKI AYATA

It is certified that error appears in the above-identified patent and that said Letters Patent is hereby corrected as shown below:

COLUMN 11

Line 21, "descrbed." should read --described.--.
    Line 34, "is" should read --are--.
    Line 50, "digitalized" should read --digitized--.
    Line 55, "via." should read --via--.
    Line 58, "digitalized" should read --digitized--.

COLUMN 12

Line 9, "orations" should read --operations--.
    Line 22, "It, then," should read --It then--.

COLUMN 13

Line 35, "send" should read --sends--.

UNITED STATES PATENT AND TRADEMARK OFFICE
CERTIFICATE OF CORRECTION

PATENT NO. : 4,713,784

DATED : December 15, 1987

INVENTOR(S) : NAOKI AYATA

It is certified that error appears in the above-identified patent and that said Letters Patent is hereby corrected as shown below:

<u>COLUMN 14</u>

Line 24, "preferably" should read --is preferably--.
Line 30, "is" should read --are--.
Line 39, "enter" should read --enters--.
Line 64, "leading" should read --reading--.

Signed and Sealed this

Twelfth Day of July, 1988

Attest:

DONALD J. QUIGG

Attesting Officer

Commissioner of Patents and Trademarks